US012367911B1

(12) United States Patent
Singh et al.

(10) Patent No.: US 12,367,911 B1
(45) Date of Patent: Jul. 22, 2025

(54) DYNAMIC GATE CONTROL SIGNAL SUPPLY VOLTAGE GENERATION IN ELECTRONIC CIRCUITS

(71) Applicant: Synopsys, Inc., Mountain View, CA (US)

(72) Inventors: Prateek Singh, Noida (IN); Kailash Kumar, Noida (IN)

(73) Assignee: Synopsys, Inc., Mountain View, CA (US)

( * ) Notice: Subject to any disclaimer, the term of this patent is extended or adjusted under 35 U.S.C. 154(b) by 270 days.

(21) Appl. No.: 18/116,219

(22) Filed: Mar. 1, 2023

(51) Int. Cl.
*H02M 1/08* (2006.01)
*G11C 5/14* (2006.01)

(52) U.S. Cl.
CPC .............. *G11C 5/147* (2013.01); *G11C 5/145* (2013.01); *H02M 1/08* (2013.01)

(58) Field of Classification Search
CPC ........... G11C 5/147; G11C 5/145; H02M 1/08
See application file for complete search history.

(56) References Cited

U.S. PATENT DOCUMENTS

| 10,027,230 | B2 * | 7/2018 | Causse | H02M 3/158 |
| 10,491,126 | B1 * | 11/2019 | Pastore | H02M 3/33523 |
| 11,664,800 | B1 * | 5/2023 | Akurathi | H03K 19/0175 |
| | | | | 327/108 |
| 12,085,970 | B1 * | 9/2024 | Agrawal | G05F 1/56 |
| 2020/0343888 | A1 * | 10/2020 | Braun | H03K 17/687 |

* cited by examiner

*Primary Examiner* — Kyle J Moody
(74) *Attorney, Agent, or Firm* — Lowenstein Sandler LLP

(57) ABSTRACT

A dynamic gate control signal generator circuit includes a pad configured to produce an output voltage, a reference generator configured to receive a supply voltage (VDDIO) and produce, based on the supply voltage, a first reference voltage signal and a second reference voltage signal, and a pad tracker circuit coupled to the reference generator, the pad tracker circuit configured to receive the output voltage of the pad and limit a high voltage of the pad to the second reference voltage signal. The dynamic gate control signal generator circuit further includes a first clamper circuit coupled to the pad tracker, the first clamper circuit configured to receive an output voltage signal from the pad tracker circuit and generate, based on the output voltage signal, a dynamic gate control signal that toggles between the first reference voltage signal and the second reference voltage signal.

20 Claims, 10 Drawing Sheets

DYNAMIC GATE CONTROL SIGNAL SUPPLY VOLTAGE GENERATION IN ELECTRONIC CIRCUITS

TECHNICAL FIELD

The present disclosure relates to electronic circuits. More specifically, embodiments disclosed herein relate to a dynamic gate control signal generator for high supply voltages.

BACKGROUND

Devices are generally built to operate within a certain voltage range. However, when a supply voltage is outside of that operating range, it can create stress in some devices. Stress in devices can lead to deterioration of the gate oxide layer and can accelerate "aging" of the device, thereby leading to a shorter life. The upper limit of a supply voltage where a device starts experiencing stress is called a voltage stress limit of that device. Some device circuits use a reference generator to generate a reference signal that is provided to a transmitter/receiver circuit of the device. However, the reference signal is generally static in nature, and conventional gate control techniques using such reference generators are able to protect the circuit only up to about twice the voltage stress limit of that device. Any voltage in excess of twice the voltage stress limit of that device causes rapid deterioration of the gate oxide layer and leads to premature aging.

SUMMARY

One embodiment is a dynamic gate control signal generator circuit including a pad configured to produce an output voltage, a reference generator configured to receive a supply voltage (VDDIO) and produce, based on the supply voltage, a first reference voltage signal and a second reference voltage signal. The dynamic gate control signal generator circuit further includes a pad tracker circuit coupled to the reference generator. The pad tracker circuit is configured to receive the output voltage of the pad and limit a high voltage of the pad to the second reference voltage signal. The dynamic gate control signal generator circuit further includes a first clamper circuit coupled to the pad tracker. The first clamper circuit is configured to receive an output voltage signal from the pad tracker circuit and generate, based on the output voltage signal, a dynamic gate control signal that toggles between the first reference voltage signal and the second reference voltage signal. The dynamic gate control signal generator circuit further includes a driver circuit coupled to the first clamper. The driver circuit is configured to receive the dynamic gate control signal that toggles between the first reference voltage signal and the second reference voltage signal.

Another embodiment is a method for dynamic gate control signal generation. The method includes receiving, by a reference generator, a supply voltage (VDDIO) and producing, based on the supply voltage, a first reference voltage signal and a second reference voltage signal. The method further includes receiving, by a pad tracker circuit coupled to the reference generator, an output voltage of a pad and limiting a high voltage of the pad to the second reference voltage signal. The method further includes receiving, by a first clamper circuit coupled to the pad tracker circuit, an output voltage signal from the pad tracker circuit and generating, based on the output voltage signal, a dynamic gate control signal that toggles between the first reference voltage signal and the second reference voltage signal. The method further includes receiving, by a driver circuit coupled to the first clamper circuit, the dynamic gate control signal that toggles between the first reference voltage signal and the second reference voltage signal.

Yet another embodiment is an interface circuit including a reference generator circuit configured to receive a supply voltage (VDDIO) and produce, based on the supply voltage, a first reference voltage signal and a second reference voltage signal. The dynamic gate control signal generator circuit further includes a pad tracker circuit coupled to the reference generator circuit. The pad tracker circuit is configured to receive an output voltage of a pad and limit a high voltage of the pad to the second reference voltage signal. The dynamic gate control signal generator circuit further includes a first clamper circuit coupled to the pad tracker. The first clamper circuit is configured to receive an output voltage signal from the pad tracker circuit and generate, based on the output voltage signal, a dynamic gate control signal that toggles between the first reference voltage signal and the second reference voltage signal. The dynamic gate control signal generator circuit further includes a driver circuit coupled to the first clamper. The driver circuit is configured to receive the dynamic gate control signal that toggles between the first reference voltage signal and the second reference voltage signal.

BRIEF DESCRIPTION OF THE DRAWINGS

The disclosure may be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

A system on chip's (SoC's) peripheral circuits interact with other chips which operate at different voltages. Accordingly, there is a need for designing I/O circuits operating at higher voltage even though the size of the chips is getting smaller. In lower technology nodes, the gate oxide breakdown limit is also increasing. Therefore, there is a need for designing I/O circuits operating at high voltages using low voltage devices, which brings in the challenge of reliability of the devices used in the circuit. Such I/O circuits are known as high voltage tolerant I/O circuits.

For example, a device with a voltage stress limit of 1.2V may be able to tolerate up to 110% of 1.2V, or 1.32V. A reference voltage generator is generally used to generate two static reference voltages VREF1 and VREF2 to ensure the maximum stress on both N-metal-oxide-semiconductor field-effect transistor (NMOS) and P-metal-oxide-semiconductor field-effect transistor (PMOS) devices is under the recommended value. Conventional gate control approaches, however, lead to voltage stress in devices when the supply voltage is greater than twice that of the voltage stress limit of the device. This may be noticed in both transmitters and receivers, and it accelerates the device degradation and sometimes also causes device breakdown. Therefore, there is a need for devices that can withstand supply voltages greater than two times the device stress limit.

Accordingly, one aspect of the present disclosure is an interface circuit that dynamically generates a gate control signal based on the supply voltage and the voltage stress limit of that device. Devices using such an interface circuit are able to withstand greater than twice the voltage stress limit of the device. The interface circuit includes a dynamic gate control signal generator that senses a pad and includes a buffer and one or more clipper and/or clamper circuits that generate the dynamic gate control signal. The dynamic gate control signal is used on the driver gates to avoid any stress on the device. Because the stress is eliminated, the life of the device (e.g., chip) is increased significantly.

Advantages of the disclosed embodiments include, but are not limited to, increased device life due to elimination of device stress. The dynamic gate control signal generator does not use any extra voltage divider circuits, in that the dynamic gate control signal generator does not use any resistor or diode divider circuit to generate any of the dynamic gate control signals. The dynamic gate control signal generator directly senses the pad and generates the gate control signals. Therefore, no current is used from the pad and there is no extra dynamic or static DC being received from the pad. Since there is no DC leakage, there can be no extra static. By adding the dynamic gate control signal generator circuit, there is no static or dynamic current being received, either from the pad or from the supply.

Figure 1:
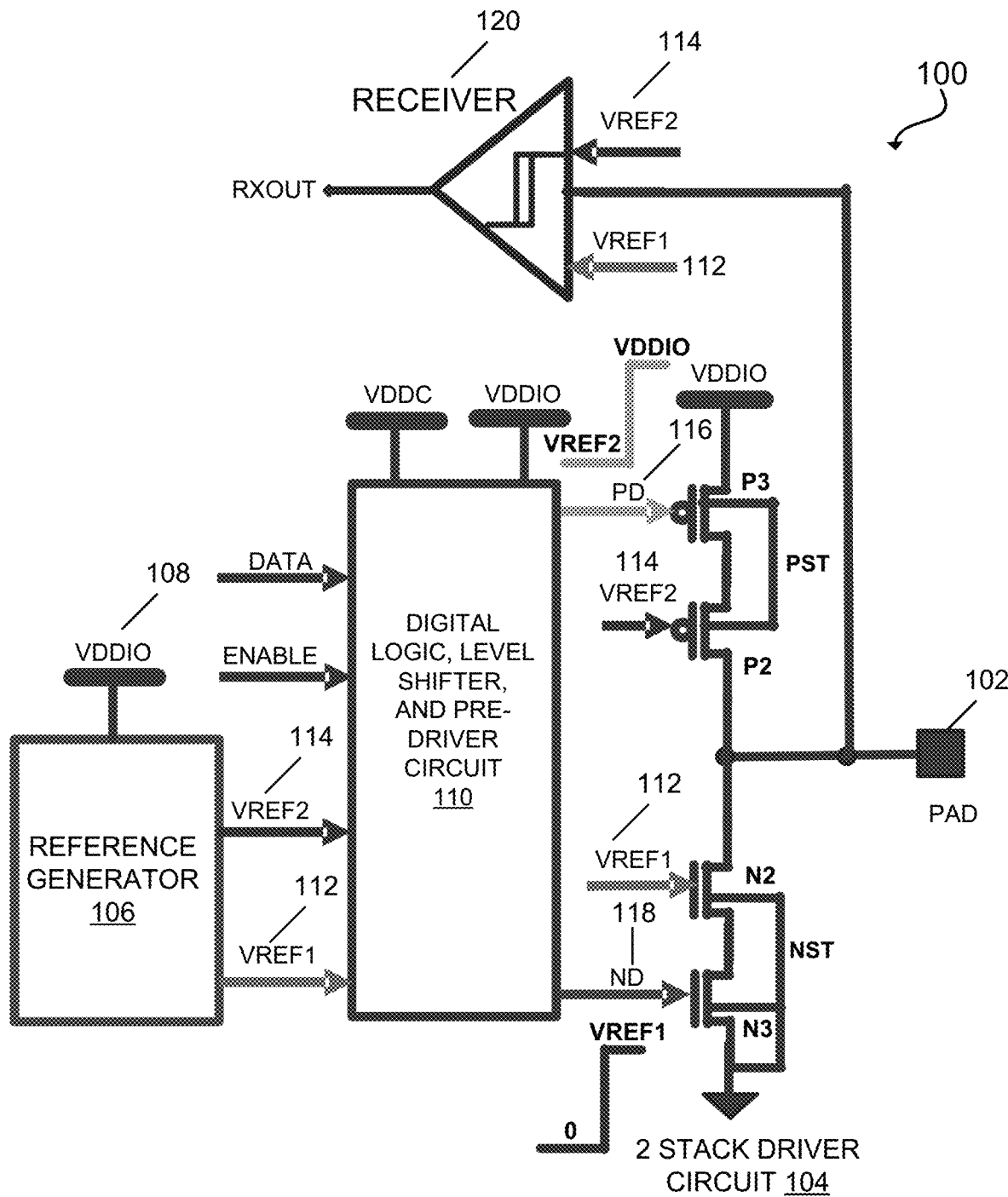
FIG. 1 illustrates an electronic circuit including a gate control signal generator, in accordance with an embodiment of the present disclosure.

FIG. 1 illustrates an electronic circuit 100 including a gate control signal generator 110, in accordance with an embodiment of the present disclosure. Circuit 100 may include a pad 102, a reference generator 106, a digital logic circuit 110, a driver circuit 104, and a receiver circuit 120. A pad 102 may include a pin on a system on chip (SoC) which may be connected to a pin on a package through a bond wire. Pad 102 may also include an exposed region of metal on a circuit board that a component lead may be soldered onto. Multiple pads in conjunction may be used to generate a component footprint or land pattern on a printed circuit board. Pad 102 may include a through hole or surface mount pad. The reference generator 106 may include a resistor based circuit where an supply voltage (e.g., 1.2V) may be supplied by an off-chip bandgap circuit, for example, and buffered by an operational amplifier. The reference generator 106 may generate bias current required by other circuits on the chip. The reference current may be generated by setting a voltage by the operational amplifier across a fixed external resistor. Circuit 110 may include processing logic that can include hardware (e.g., processing device, circuitry, dedicated logic, programmable logic, microcode, hardware of a device, integrated circuit, etc.), software (e.g., instructions run or executed on a processing device), or a combination thereof. Circuit 110 may generate data signals for the NMOS side (e.g., data signal Nd (118)) and PMOS side (e.g., data signal Pd (116)), respectively, signals that drive to the pad. Circuit 100 may be used for an I/O with supply that is less than or equal to the twice the voltage stress limit of driver circuit 104. For example, if driver circuit 104 can operate at 1.2 volts and the I/O voltage (VDDIO) is at 1.8 volts, the reference generator 106 generates two reference signals VREF1 (112) and VREF2 (114). VREF1 is used to help avoid stress on the NMOS side, and VREF2 is used to help avoid stress on the PMOS side of the driver circuit 104. It should be noted, however, that VREF1 and VREF2 here are static in nature.

In order to avoid stress at N2, VREF1 is around 1.2 volts, which is the voltage stress limit (Vstress) of N2. VREF2 would be VDDIO minus Vstress, or VDDIO minus VREF1. Therefore, if VDDIO is at 1.8V then VREF2 will be around 0.6V. Data signal Pd 116 may toggle between VREF2 and VDDIO, and data signal Nd 118 may toggle between 0V and VREF1. The receiver circuit 120 may include any circuit such as peripheral circuits operating at the same or a different voltage.

Figure 2A:
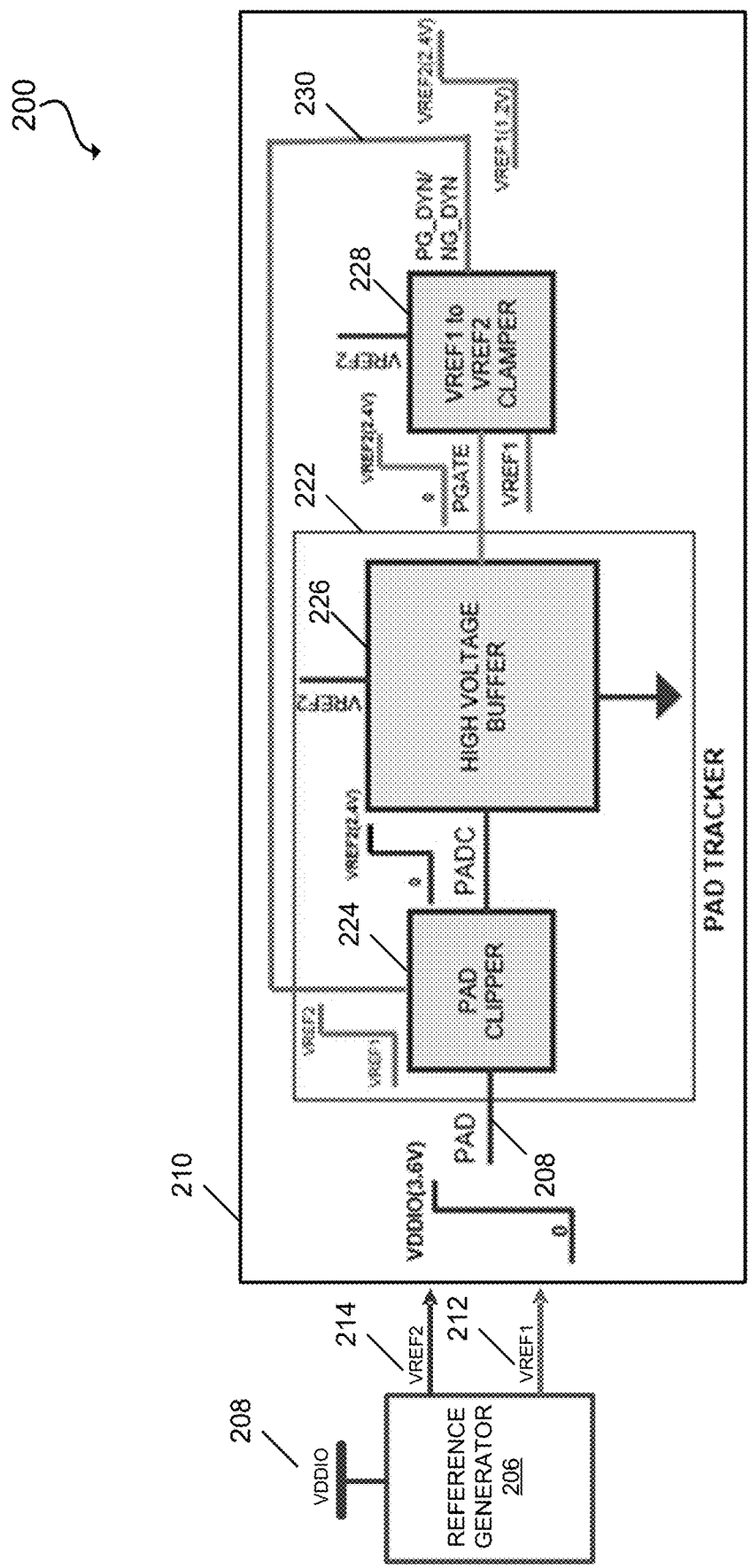
FIG. 2A illustrates an electronic circuit including a dynamic gate control signal generator, in accordance with an embodiment of the present disclosure.

FIG. 2A illustrates an electronic circuit 200 including a dynamic gate control signal generator 210, in accordance with an embodiment of the present disclosure. Circuit 200 includes a reference generator 206, similar to reference generator 106, which is configured to generate reference signals VREF1 (212) and VREF2 (214).

In order to protect the driver circuit from stress, which can be caused anytime the voltage difference between two nodes, for example, gate to drain or gate to source or source to drain for the PMOS or for the NMOS side, goes over the voltage stress limit of the device, the dynamic gate control signal generator 210 generates dynamic gate control signals based on the supply voltage and the voltage stress limit of the device. For example, if the voltage stress limit of the device is 1.2V, then the maximum it can withstand is about 1.32V. However, when VDDIO is about 3.6V, VREF1 would be 1.2V (Vstress), and VREF2 would be VDDIO-Vstress or 2.4V. Therefore, the dynamic gate control signal generator 210 produces dynamic gate control signals PG_DYN and NG_DYN 230, whose value toggles between VREF1 and VREF2 in order to avoid device stress on the PMOS side and the NMOS side of the driver circuit. The dynamic gate control signal generator 210 may include a pad tracker circuit 222 that receives the supply voltage (VDDIO). Therefore, when supply voltage is about 3.6V, the pad voltage 208 will switch from 0V to 3.6V.

The dynamic gate control signal generator 210 determines the voltage level at the gate based on the supply voltage and the voltage stress limit of the device. For example, when pad voltage 208 is 0V, the gate signal should be at VREF1 (e.g., 1.2V), and when the pad voltage 208 goes high, the gate signal should be at VREF2 (e.g., 2.4V). Pad tracker circuit 222 is a sensing circuit that senses the pad voltage and changes the gate signal of the PMOS side and the NMOS side to avoid stress.

For example, when the supply voltage (VDDIO) is three times or four times the voltage stress limit of the device, the pad tracker circuit 222 senses the pad voltage 208 and clips this voltage using a pad clipper circuit 224. Therefore, the supply voltage which ranged from 0V to 3.6V, for example, is now clipped to range from 0V to VREF2 (e.g., 2.4V).

The dynamic gate control signal generator 210 further includes a high voltage buffer 226 that receives the clipped voltage from the pad clipper circuit 224. Buffer 226 is configured such that it can tolerate the stress because VREF2 is still at 2.4V, for example. The output voltage of the buffer 226 is a signal that is toggling from 0V to VREF2, and this signal is synced with the pad so the device does not experience any stress.

The dynamic gate control signal generator 210 further includes a clamper circuit 228 that receives the PGATE signal from the high voltage buffer 226. The clamper circuit 228 further reduces the range of the PGATE signal from 0V to 2.4V to VREF1 (1.2V) to VREF2 (2.4V), such that the voltage difference between two nodes, for example, gate to drain or gate to source or source to drain for the PMOS or for the NMOS side, is always under the voltage stress limit of the device (e.g., 1.2V). The dynamic signal generated by the clamper circuit 228 is looped back to the pad clipper circuit 224 to ensure that the output voltage does not exceed 2.4V.

Figure 2B:
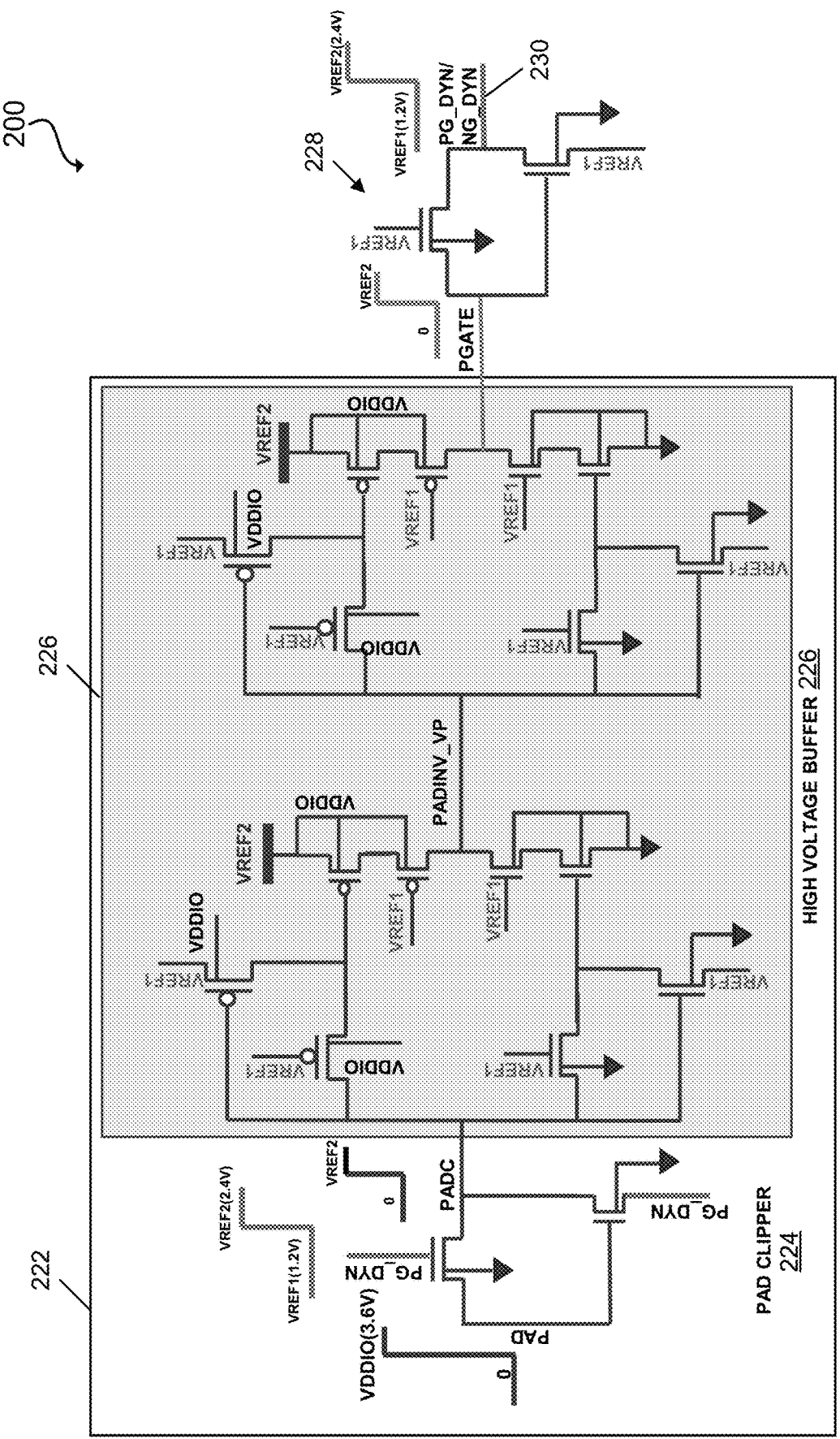
FIG. 2B is a circuit diagram of the dynamic gate control signal generator illustrated in FIG. 2A, in accordance with an embodiment of the present disclosure.

FIG. 2B is a circuit diagram 200 of the dynamic gate control signal generator 210 illustrated in FIG. 2A, in accordance with an embodiment of the present disclosure. As illustrated, pad clipper circuit 224 includes two NMOS devices, and high voltage buffer 226 includes two or more PMOS devices and two or more NMOS devices. Similar to the pad clipper circuit 224, the clamper circuit 228 includes two NMOS devices, as illustrated.

Figure 2C:
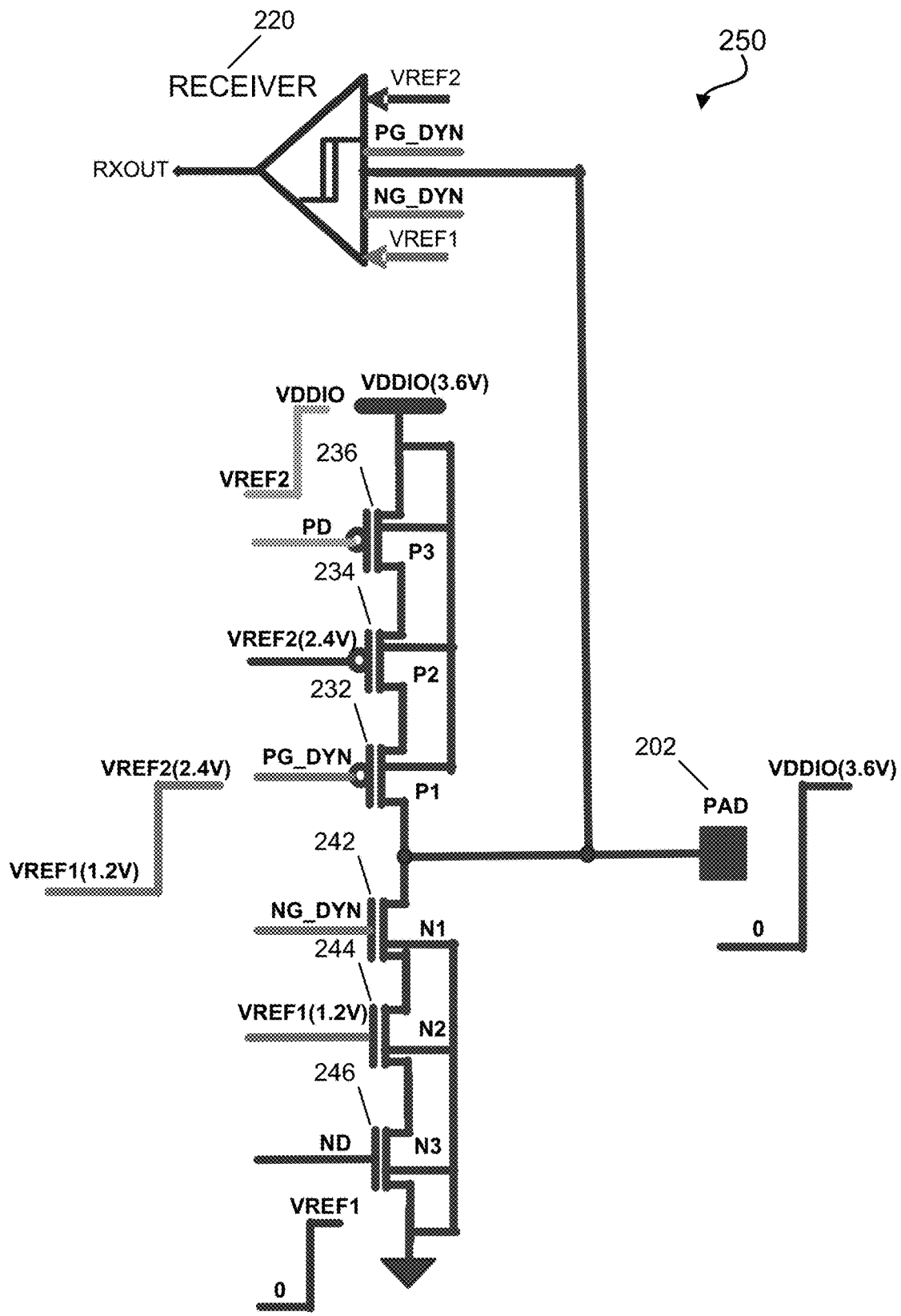
FIG. 2C illustrates a driver circuit component of the dynamic gate control signal generator illustrated in FIG. 2A, in accordance with an embodiment of the present disclosure.

FIG. 2C illustrates a driver circuit component 250 of the dynamic gate control signal generator 210 illustrated in FIG. 2A, in accordance with an embodiment of the present disclosure. As illustrated, the driver circuit component 250 that functions in conjunction with the dynamic gate control signal generator 210 includes a three-stack driver circuit including three PMOS devices 232, 234, 236 coupled in series on the PMOS side of the driver circuit, and three NMOS devices 242, 244, 246 coupled in series on the NMOS side of the driver circuit. Because the dynamic gate reference signals are received from the dynamic gate reference signal generator 210, neither the PMOS side nor the NMOS side experiences any stress. Even when pad voltage 202 toggles between 0V and 3.6V, N3 will toggle from 0V to VREF1 and P3 will toggle from VREF2 to VDDIO, and the difference between 0V to VREF1 and VREF1 to VREF2 is 1.2V, which is the voltage stress limit of the device. For example, when pad voltage 202 is 0V, ND data signal is high (or VREF1 of 1.2V), and the PMOS side would be OFF. So PD will be at VDDIO (e.g., 3.6V), and VREF2 is at 2.4V. So the difference between any of the two nodes would be 1.2V, which is the voltage stress limit of the device. Similarly, when the pad voltage 202 is high (e.g., 3.6V), both N1 gate and P1 gate will be at VREF2 (e.g., 2.4V), and the voltage difference between any two nodes would be 1.2V, which is the voltage stress limit of the device. Accordingly, the dynamic gate control signal generator 210 avoids stress on the driver circuit component 250 by using dynamically generated gate control signals. The same signals (e.g., the PG_DYN, the PGATE dynamic and NGATE dynamic) are sent to the receiver circuit 220 to avoid stress on the receiver because the receiver structure may be similar to the driver circuit when the signals are received. Receiver circuit 220 may include any circuit such as peripheral circuits operating at the same or a different voltage.

Figure 3:
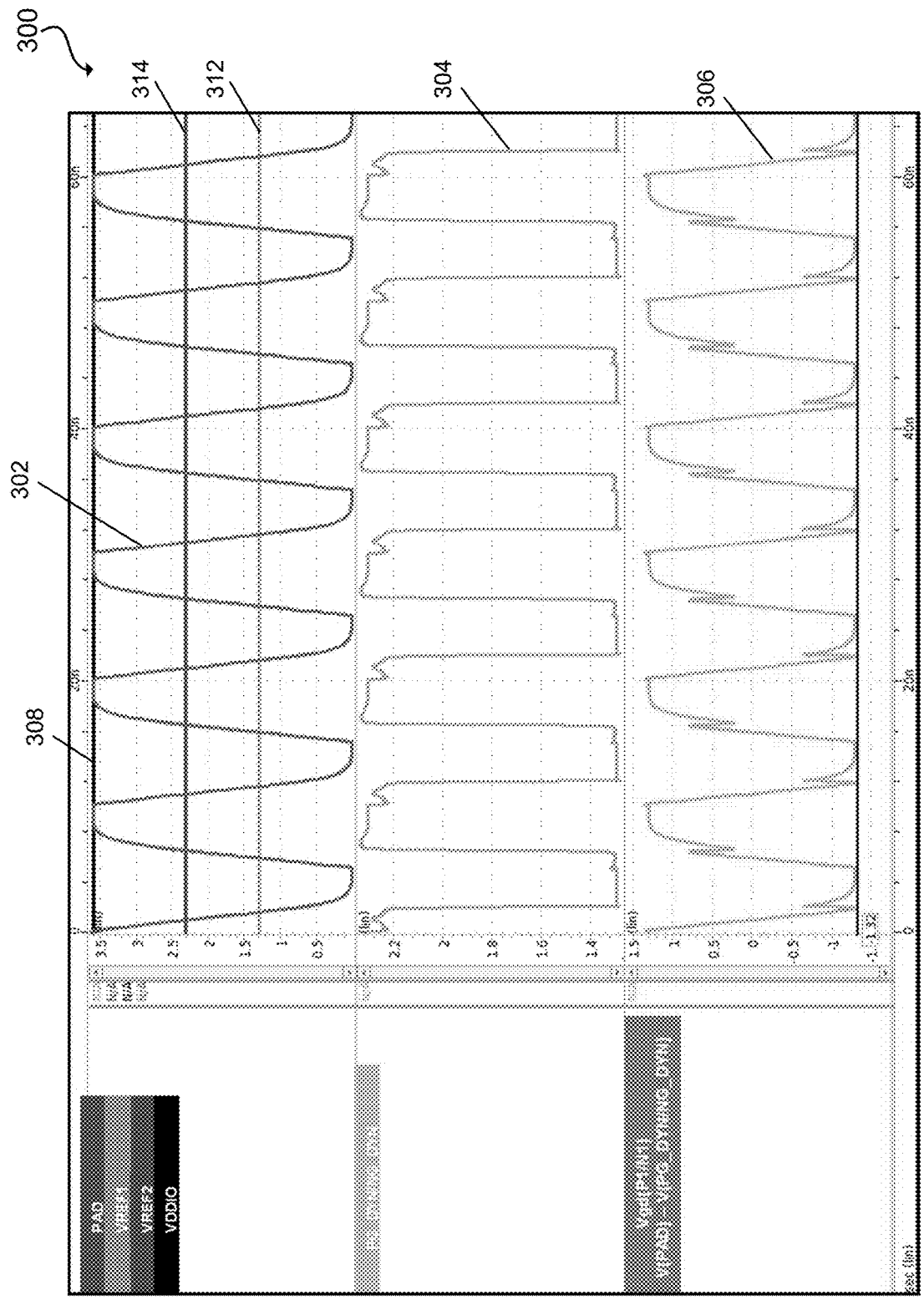
FIG. 3 is a graph illustrating operating voltages in a dynamic gate control signal generator, in accordance with an embodiment of the present disclosure.

FIG. 3 is a graph 300 illustrating waveforms of operating voltages in the dynamic gate control signal generator 210, in accordance with an embodiment of the present disclosure. Waveform 302 represents the pad voltage, and so the pad voltage toggles from 0V to 3.6V. Waveform 308 represents the VDDIO, which is a constant at 3.6V. Waveform 312 represents VREF1, which is around 1.2V, and waveform 314 represents VREF2, which is around 2.4V. Both VREF1 and VREF2 are generated from the reference generator 206. Waveform 304 represents PG_DYN, which is the PGATE dynamic and NGATE dynamic signal toggling from 1.2V to 2.4V or from VREF1 to VREF2. Waveform 306 represents Vgd, which is the gate difference from drain to gate for the NMOS (N1), or gate to drain for the PMOS (P1), which has a maximum difference of 1.32V, which is under the voltage stress limit of the device.

Figure 4A:
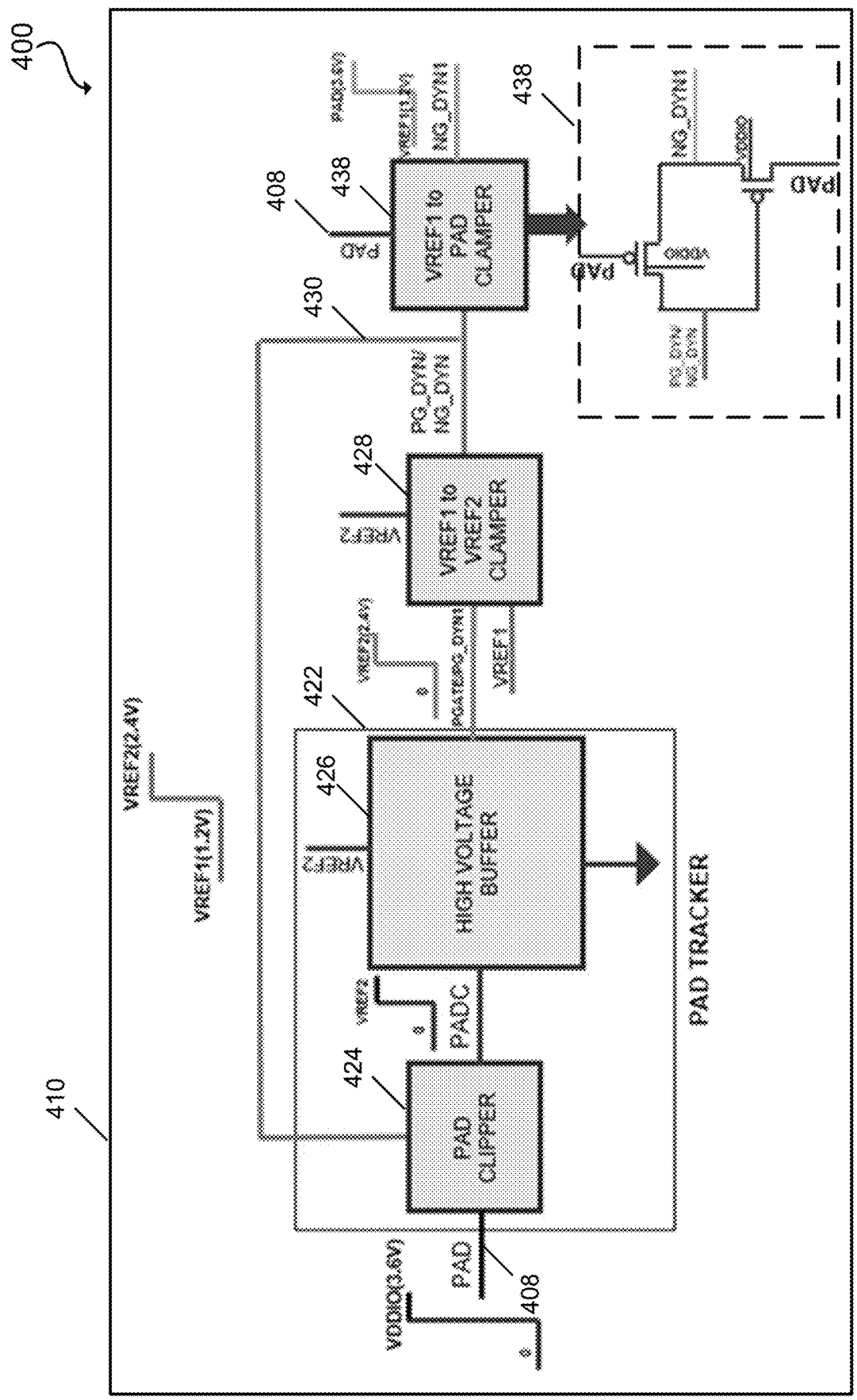
FIG. 4A illustrates an electronic circuit including a dynamic gate control signal generator, in accordance with an embodiment of the present disclosure.

FIG. 4A illustrates an electronic circuit 400 including a dynamic gate control signal generator 410 with better reliability and performance, in accordance with an embodiment of the present disclosure. In order to protect the driver circuit from stress, which can be caused anytime the voltage difference between two nodes, for example, gate to drain or gate to source or source to drain for the PMOS or for the NMOS side, goes over the voltage stress limit of the device, the dynamic gate control signal generator 410 generates dynamic gate control signals based on the supply voltage and the voltage stress limit of the device. For example, if the voltage stress limit of the device is 1.2V, then the maximum it can withstand is about 1.32V. Here, when the pad voltage 408 is at VDDIO of about 3.6V, VREF1 would be 1.2V (Vstress), and VREF2 would be VDDIO-Vstress or 2.4V. Therefore, the dynamic gate control signal generator 410 produces dynamic gate control signals PG_DYN and NG_DYN 430, whose value toggles between VREF1 and VREF2 in order to avoid device stress on the PMOS side and the NMOS side of the driver circuit. The dynamic gate control signal generator 410 may include a pad tracker circuit 422 that receives the supply voltage (VDDIO). Therefore, when supply voltage is about 3.6V, the pad voltage 408 will toggle from 0V to 3.6V.

The dynamic gate control signal generator 410 determines the voltage level at the gate based on the supply voltage and the voltage stress limit of the device. For example, when pad voltage 408 is 0V, the gate signal should be at VREF1 (e.g., 1.2V), and when the pad voltage 408 goes high, the gate signal should be at VREF2 (e.g., 2.4V). Pad tracker circuit 422 is a sensing circuit that senses the pad voltage and changes the gate signal of the PMOS side and the NMOS side to avoid stress.

For example, when the supply voltage (VDDIO) is between two times and three times the voltage stress limit of the device, the pad tracker circuit 422 senses the pad voltage 408 and clips this voltage using a pad clipper circuit 424. Therefore, the supply voltage which ranged from 0V to 3.6V, for example, is now clipped to range from 0V to VREF2 (e.g., 2.4V).

The dynamic gate control signal generator 410 further includes a high voltage buffer 426 that receives the clipped voltage from the pad clipper circuit 424. Buffer 426 is configured such that it can tolerate the stress because VREF2 is still at 2.4V, for example. The output voltage of the buffer 426 is a signal that is toggling from 0V to VREF2, and this signal is synced with the pad so the device does not experience any stress.

The dynamic gate control signal generator 410 further includes a clamper circuit 428 that receives the PGATE signal from the high voltage buffer 426. The clamper circuit 428 further reduces the range of the PGATE signal from 0V to 2.4V to VREF1 (1.2V) to VREF2 (2.4V), such that the voltage difference between two nodes, for example, gate to drain or gate to source or source to drain for the PMOS or for the NMOS side, is always under the voltage stress limit of the device (e.g., 1.2V). The dynamic signal generated by the clamper circuit 428 is fed back to the pad clipper circuit 424 to ensure that the output voltage does not exceed 2.4V.

The dynamic gate control signal generator 410 further includes a second clamper circuit 438 that receives the dynamic gate reference signal 430 from the first clamper circuit 428, and clamps the gate reference signal 430 to toggle between VREF1 (1.2V) and the pad voltage (3.6V). As illustrated, the second clamper circuit 438 may include two PMOS devices.

Figure 4B:
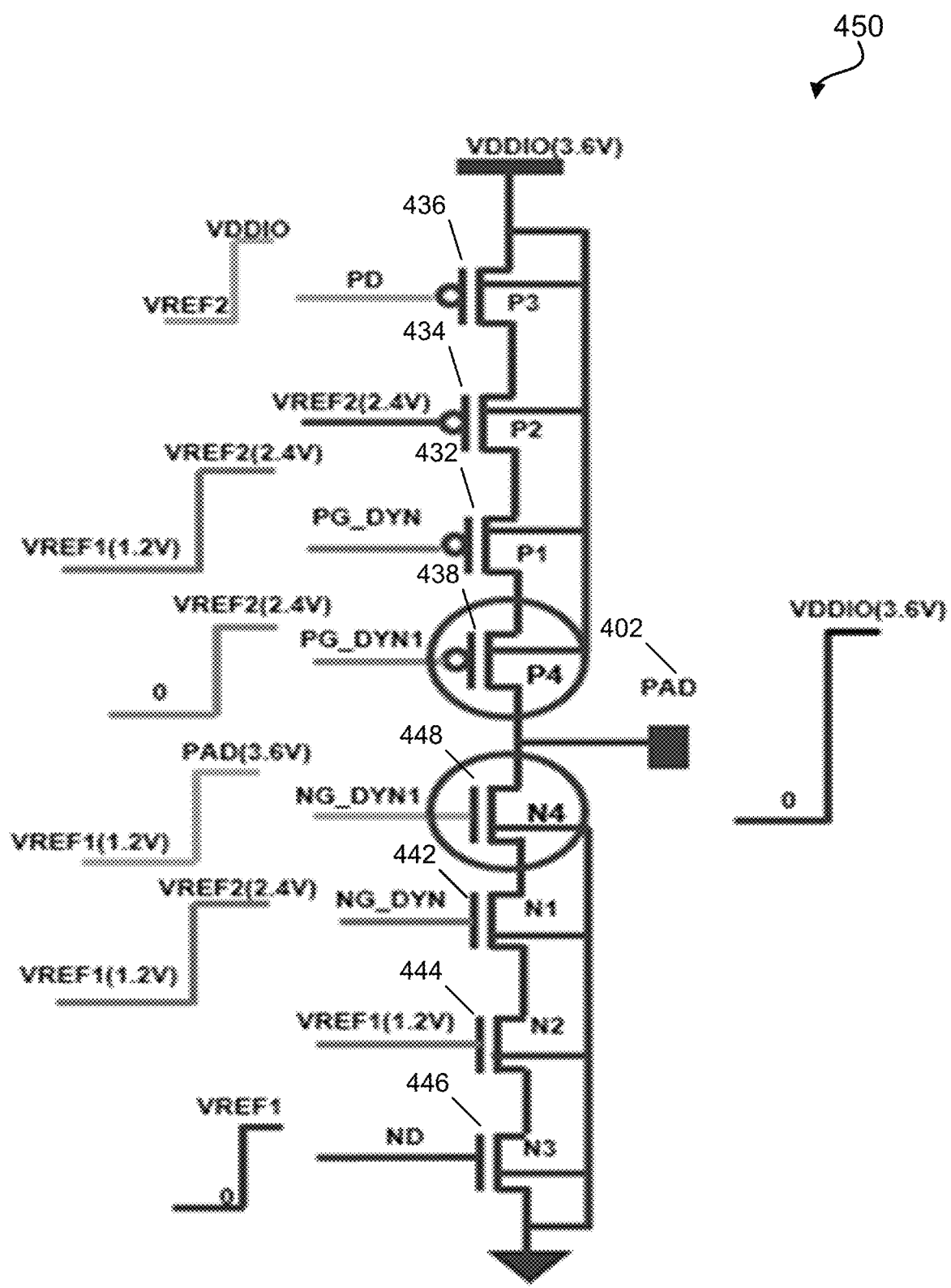
FIG. 4B illustrates a driver circuit component of the dynamic gate control signal generator illustrated in FIG. 4A, in accordance with an embodiment of the present disclosure.

FIG. 4B illustrates a driver circuit component 450 of the dynamic gate control signal generator 400 illustrated in FIG. 4A, in accordance with an embodiment of the present disclosure. As illustrated, the driver circuit component 450 that functions in conjunction with the dynamic gate control signal generator 410 includes a four-stack driver circuit including four PMOS devices 432, 434, 436, 438 coupled in series on the PMOS side of the driver circuit, and four NMOS devices 442, 444, 446, 448 coupled in series on the NMOS side of the driver circuit. Because the dynamic gate reference signals are received from the dynamic gate reference signal generator 410, neither the PMOS side nor the NMOS side experiences any stress.

When pad voltage 402 toggles between 0V and 3.6V, N3 will toggle from 0V to VREF1 and P3 will toggle from VREF2 to VDDIO, and the difference between 0V to VREF1 and VREF1 to VREF2 is 1.2V, which is the voltage stress limit of the device. Similarly, when pad voltage 402 is 0V, ND data signal is high (or VREF1 of 1.2V), and the PMOS side would be OFF. So PD will be at VDDIO (e.g., 3.6V), and VREF2 is at 2.4V. So the difference between any of the two nodes would be 1.2V, which is the voltage stress limit of the device. Similarly, when the pad voltage 402 is high (e.g., 3.6V), both N1 gate and P1 gate will be at VREF2 (e.g, 2.4V), and the voltage difference between any two nodes would be 1.2V, which is the voltage stress limit of the device. The dynamic gate control signal generator 410 further generates dynamic gate control signals PG_DYN1 and NG_DYN1. PG_DYN1 toggles between 0V and VREF2 (2.4V), and NG_DYN1 toggles between VREF1 (1.2V) and the pad voltage (3.6V). In order to protect P4 from stress and to have a better reliability, P4 toggles from 0V to VREF2 (2.4V). So when the pad voltage is 0V, P4 would be at 0V. When pad voltage is high, 3.6V, P4 must not be more than 2.4V or VREF2. For the NMOS N4, when the pad voltage is high, N4 is at pad voltage, which is 3.6V. When pad voltage is low, N4 cannot go below 1.2V, else there would be stress on the device. Therefore, gate signal for the NMOS gate N4 toggles from VREF1 to the pad. Accordingly, the dynamic gate control signal generator 410 avoids stress on the driver circuit component 450 by using dynamically generated gate control signals.

Figure 5A:
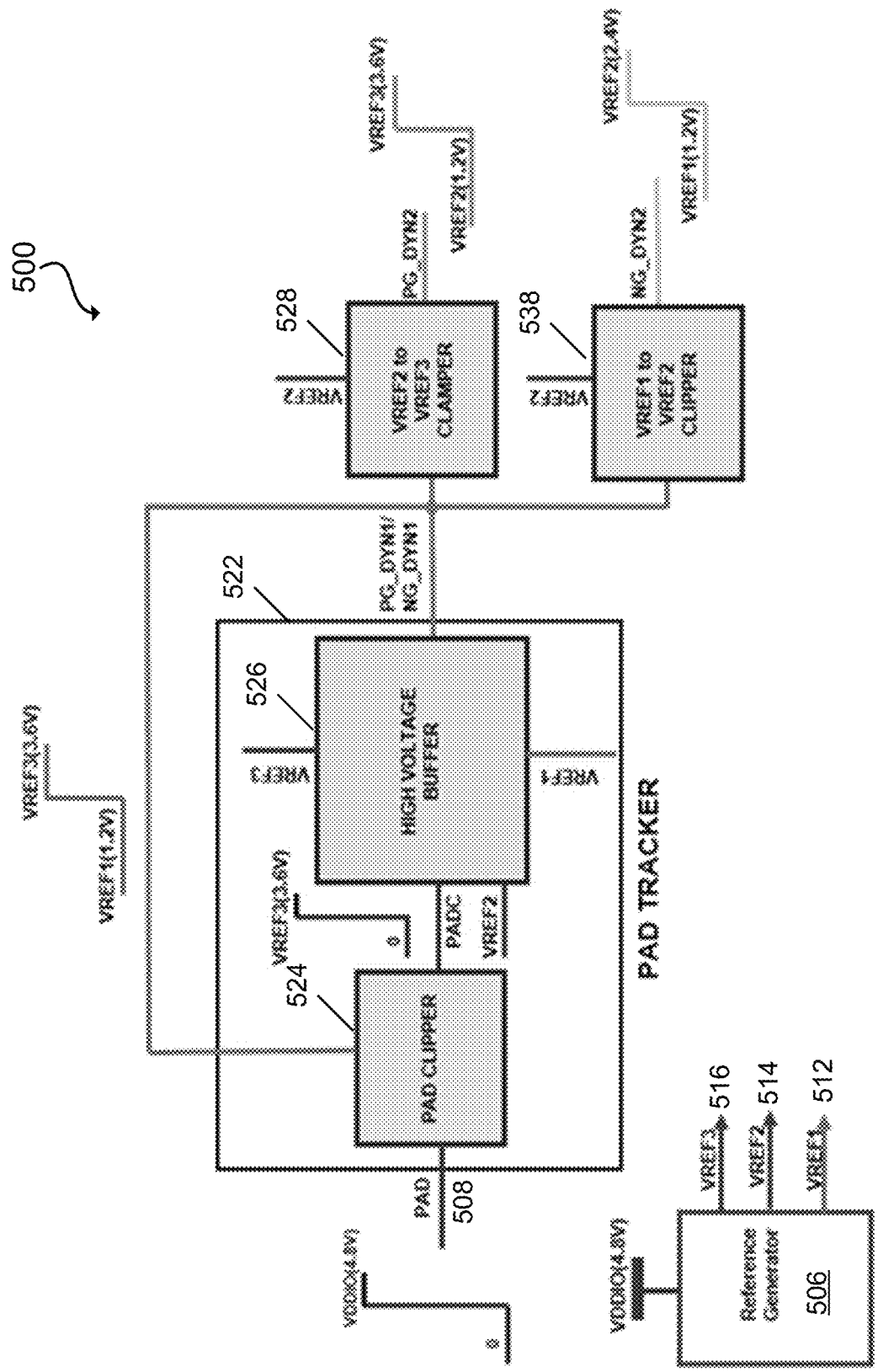
FIG. 5A illustrates an electronic circuit including a dynamic gate control signal generator, in accordance with an embodiment of the present disclosure.

FIG. 5A illustrates an electronic circuit including a dynamic gate control signal generator 500 for VDDIO between three times and four times the voltage stress limit of the device, in accordance with an embodiment of the present disclosure. The dynamic gate control signal generator 500 includes a reference generator 506 that generates three reference signals instead of two. For example, the reference generator 506 generates reference signals VREF1 (512), VREF2 (514), and VREF3 (516). In order to protect the driver circuit from stress, which can be caused anytime the voltage difference between two nodes, for example, gate to drain or gate to source or source to drain for the PMOS or for the NMOS side, goes over the voltage stress limit of the device, the dynamic gate control signal generator 500 generates dynamic gate control signals based on the supply voltage and the voltage stress limit of the device. For example, if the voltage stress limit of the device is 1.2V, then the maximum it can withstand is about 1.32V. Here, when the pad voltage 508 is at VDDIO of about 4.8V, VREF1 would be 1.2V (Vstress), VREF2 would be VREF1+Vstress or 2.4V, and VREF3 would be VDDIO-Vstress or 3.6V. Therefore, the dynamic gate control signal generator 500 produces dynamic gate control signals PG_DYN1 and NG_DYN1 whose value toggles between VREF1 and VREF2 in order to avoid device stress on the PMOS side and the NMOS side of the driver circuit. The dynamic gate control signal generator 500 may include a pad tracker circuit 522 that receives the pad voltage 508. Therefore, when supply voltage is about 4.8V, the pad voltage 508 will toggle from 0V to 4.8V.

The dynamic gate control signal generator 500 determines the voltage level at the gate based on the supply voltage and the voltage stress limit of the device. For example, when pad voltage 508 is 0V, the gate signal should be at VREF1 (e.g., 1.2V), and when the pad voltage 508 goes high, the gate signal should be at VREF2 (e.g., 2.4V). Pad tracker circuit 522 is a sensing circuit that senses the pad voltage and changes the gate signal of the PMOS side and the NMOS side to avoid stress.

For example, when the supply voltage (VDDIO) is between three times and four times the voltage stress limit of the device, the pad tracker circuit 522 senses the pad voltage 508 and clips this voltage using a pad clipper circuit 524. Therefore, the supply voltage which ranged from 0V to 4.8V, for example, is now clipped to range from 0V to VREF3 (e.g., 3.6V).

The dynamic gate control signal generator 500 further includes a high voltage buffer 526 that receives the clipped voltage from the pad clipper circuit 524. Buffer 526 is configured such that it can tolerate the stress because VREF3 is still at 3.6V, for example. The output voltage of the buffer 526 is a signal that is toggling from VREF1 (1.2V) and VREF3 (3.6V), and this signal is synced with the pad so the device does not experience any stress.

The dynamic gate control signal generator 500 further includes a first clamper circuit 528 that receives the PG_DYN1 and NG_DYN1 signals from the high voltage buffer 526. The clamper circuit 528 further reduces the range of the PG_DYN1 signal from VREF1 (1.2V) to VREF3 (3.6V), such that the voltage difference between two nodes, for example, gate to drain or gate to source or source to drain for the PMOS is always under the voltage stress limit of the device (e.g., 1.2V). The dynamic gate control signal generator 500 further includes a second clamper circuit 538 that receives the PG_DYN1 and NG_DYN1 signals from the high voltage buffer 526. The clamper circuit 538 further reduces the range of the NG_DYN1 signal from VREF1 (1.2V) to VREF2 (2.4V), such that the voltage difference between two nodes, for example, gate to drain or gate to source or source to drain for the NMOS side, is always under the voltage stress limit of the device (e.g., 1.2V).

Figure 5B:
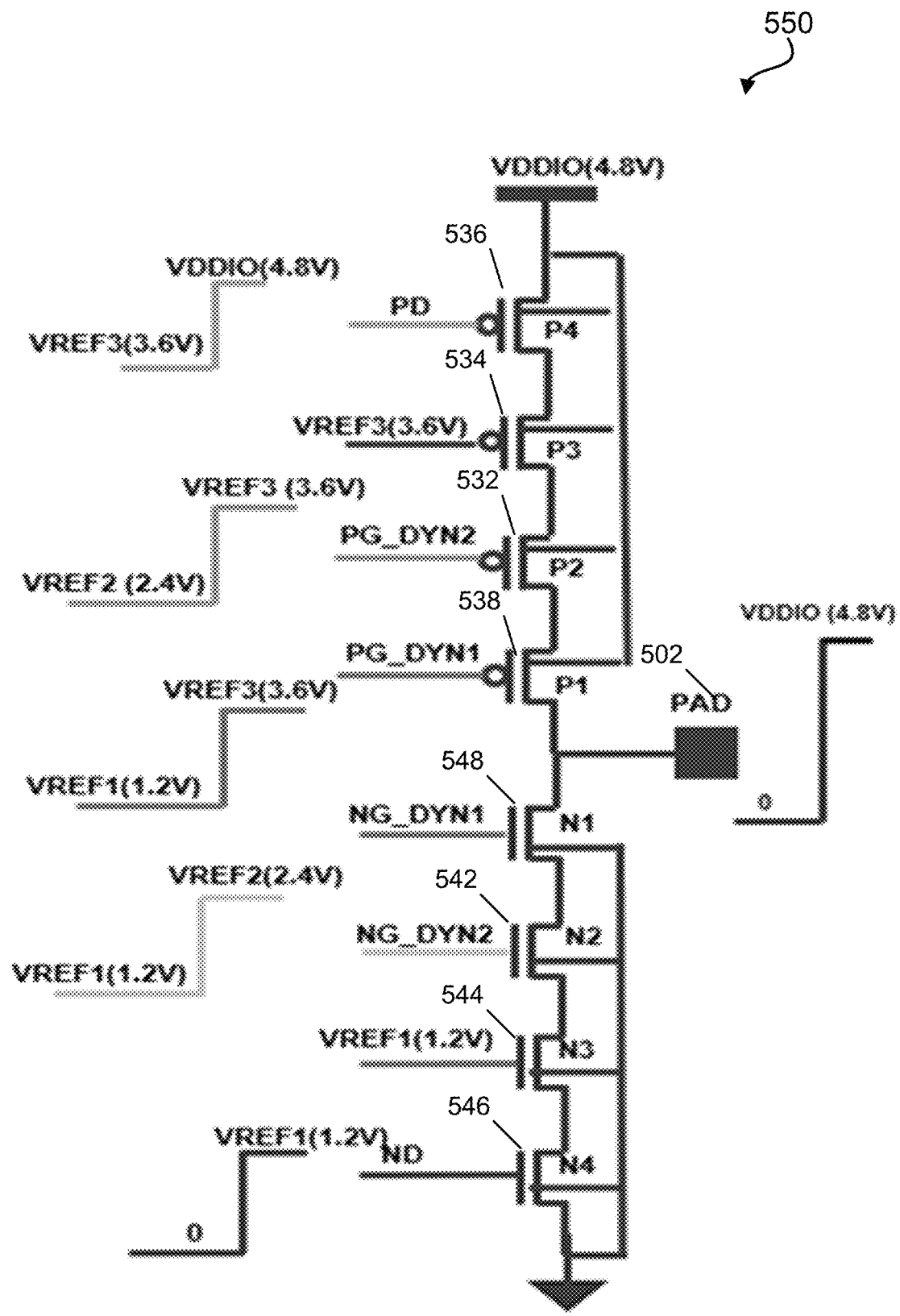
FIG. 5B illustrates a driver circuit component of the dynamic gate control signal generator illustrated in FIG. 5A, in accordance with an embodiment of the present disclosure.

FIG. 5B illustrates a driver circuit component 550 of the dynamic gate control signal generator 500 illustrated in FIG. 5A, in accordance with an embodiment of the present disclosure. As illustrated, the driver circuit component 550 that functions in conjunction with the dynamic gate control signal generator 500 includes a four-stack driver circuit including four PMOS devices 532, 534, 536, 538 coupled in series on the PMOS side of the driver circuit, and four NMOS devices 542, 544, 546, 548 coupled in series on the NMOS side of the driver circuit. Because the dynamic gate reference signals are received from the dynamic gate reference signal generator 500, neither the PMOS side nor the NMOS side experiences any stress.

When pad voltage 502 toggles between 0V and 4.8V, ND will toggle from 0V to VREF1 (1.2V) and PD will toggle from VREF3 (3.6V) to VDDIO, and the difference between 0V to VREF1 and VREF3 to VDDIO is 1.2V, which is the voltage stress limit of the device. In this example, gate control signals for P3 and N3 are static at VREF3 (3.6V) and VREF1 (1.2V), respectively. Similarly, PG_DYN2 would toggle between VREF2 (2.4V) and VREF3 (3.6V), NG_DYN2 would toggle between VREF1 (1.2V) and VRED2 (2.4V). Consequently, PG_DYN1 would toggle between VREF1 (1.2V) and VREF3 (3.6V), and NG_DYN1 would toggle between VREF1 (1.2V) and VREF2 (2.4V). Accordingly, the dynamic gate control signal generator 500 avoids stress on the driver circuit component 550 by using dynamically generated gate control signals PG_DYN1, NG_DYN1, PG_DYN2, and NG_DYN2, and keeping the voltage difference between two nodes, for example, gate to drain or gate to source or source to drain for the PMOS or for the NMOS side, under the voltage stress limit of the device.

Figure 6:
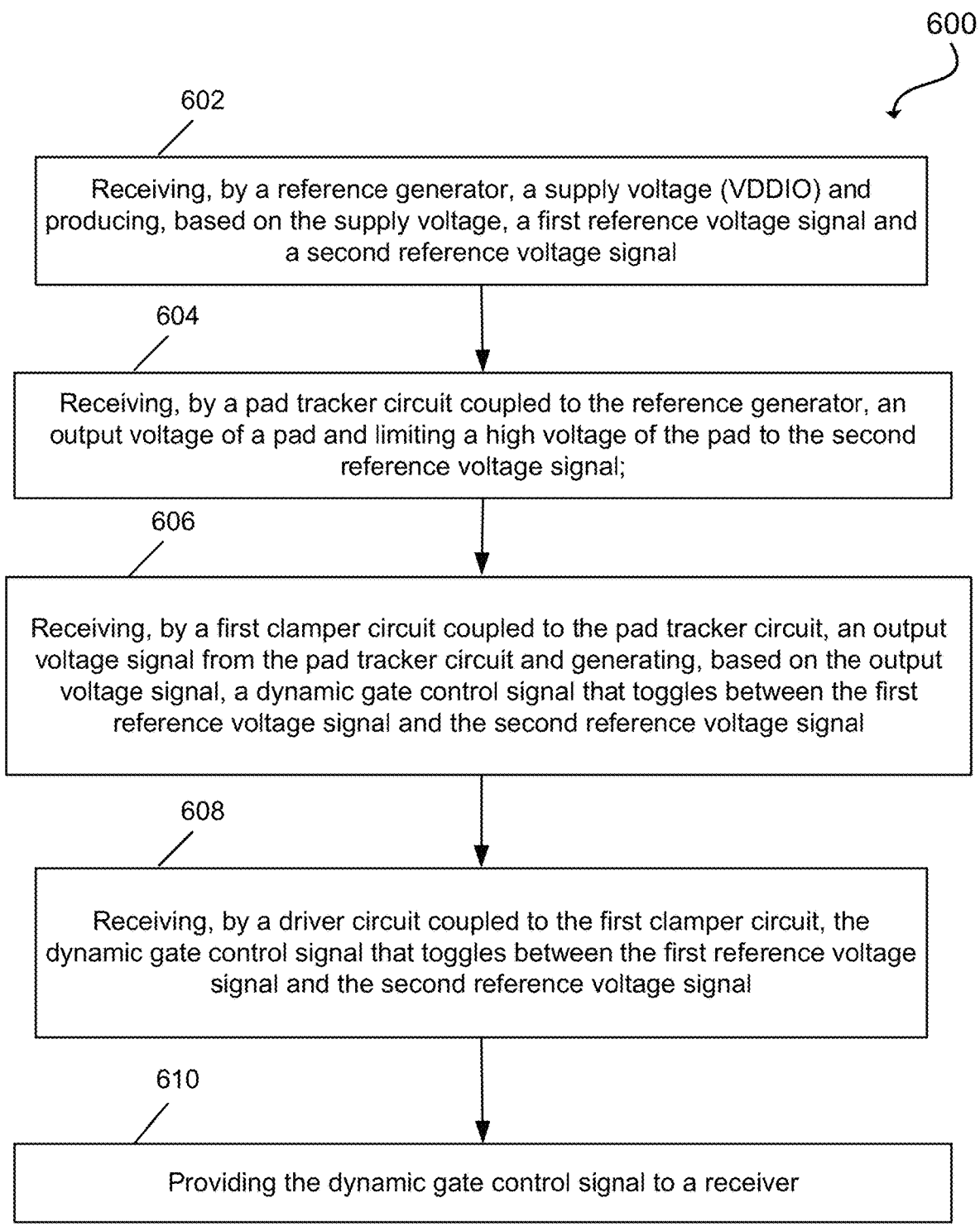
FIG. 6 illustrates example operations in a method for dynamic gate control signal generation, in accordance with an embodiment of the present disclosure.

FIG. 6 illustrates example operations in a method 600 for dynamic gate control signal generation, in accordance with an embodiment of the present disclosure. The method 600 can be performed by processing logic that can include hardware (e.g., processing device, circuitry, dedicated logic, programmable logic, microcode, hardware of a device, integrated circuit, etc.), such as circuit 110, or software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 602, the method includes receiving, by a reference generator (e.g., reference generator 206), a supply voltage (VDDIO) and producing, based on the supply voltage, a first reference voltage signal and a second reference voltage signal (e.g., VREF1 and VREF2). At operation 604, the method further includes receiving, by a pad tracker circuit (e.g., pad tracker 222) coupled to the reference generator, an output voltage of a pad and limiting a high voltage of the pad to the second reference voltage signal. At operation 606, the method further includes receiving, by a clamper circuit (e.g., clamper 228) coupled to the pad tracker circuit, an output voltage signal from the pad tracker circuit and generating, based on the output voltage signal, a dynamic gate control signal that toggles between the first reference voltage signal and the second reference voltage signal. At operation 608, the method further includes receiving, by a driver circuit (e.g., driver circuit 250) coupled to the clamper circuit, the dynamic gate control signal that toggles between the first reference voltage signal and the second reference voltage signal. At operation 610, the method may include providing the dynamic gate control signal to a receiver circuit (e.g., receiver 220).

The method may further include receiving, by a pad clipper circuit (e.g., pad clipper circuit 224), the output voltage of the pad and limiting the high voltage to the second reference voltage signal. The method may further include buffering, by a buffer circuit (e.g., high voltage buffer 226) coupled to the pad clipper circuit, the high voltage of the pad. In some embodiments, the first reference voltage signal is a voltage stress limit of the driver circuit, and wherein the second reference voltage signal is a difference between the supply voltage (VDDIO) and the first reference voltage signal. In some embodiments, the supply voltage is greater than two times the voltage stress limit of the driver circuit, for example three times the voltage stress limit of the driver circuit, or four times the voltage stress limit of the driver circuit. The method may also further include providing, as part of the driver circuit, at least three first type of transistors coupled in series, and providing, as part of the driver circuit, at least three second type of transistors coupled in series.

In some embodiments, the first type of transistors include a N-metal oxide semiconductor (NMOS) field effect transistor, and the second type of transistors include a P-metal oxide semiconductor (PMOS) field effect transistor. The method further includes receiving, by a second clamper circuit (e.g., clamper 438) coupled to the first clamper circuit, the dynamic gate control signal and the output voltage of the pad and generating, based on the dynamic gate control signal and the output voltage of the pad, a second dynamic gate control signal that toggles between the first reference voltage signal and the output voltage of the pad. The method further includes receiving, by a second driver circuit (e.g., driver circuit 450) coupled to the second clamper circuit, the second dynamic gate control signal that toggles between the first reference voltage signal and the output voltage of the pad. The method further includes providing, as part of the second driver circuit, a fourth first type of transistor coupled in series to the at least three first type of transistors, and providing, as part of the second driver circuit, a fourth second type of transistor coupled in series to the at least three second type of transistors.

The method further includes generating, by the reference generator, based on the supply voltage, a third reference voltage signal (e.g., VREF3), wherein the first reference voltage signal is a voltage stress limit of the driver circuit, wherein the second reference voltage signal is a sum of the first reference voltage signal and the voltage stress limit of the driver circuit, and wherein the third reference voltage signal is a difference between the supply voltage (VDDIO) and the voltage stress limit of the driver circuit.

The electronic circuits described in the present disclosure may be used in any type of input/output interface, including but not limited to inter-integrated circuits (I2C), improved inter-integrated circuits (I3C), secure digital embedded multimedia card (SD-eMMC) circuits, a system power management interface (SPMI), a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), and a non-volatile memory express (NVMe) interface.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It may be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It may be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A dynamic gate control signal generator circuit, the generator circuit comprising:
   a pad configured to produce an output voltage;
   a reference generator configured to receive a supply voltage and produce, based on the supply voltage, a first reference voltage signal and a second reference voltage signal;
   a pad tracker circuit coupled to the reference generator, the pad tracker circuit configured to receive the output voltage of the pad and limit a high voltage of the pad to the second reference voltage signal;
   a first clamper circuit coupled to the pad tracker, the first clamper circuit configured to receive an output voltage signal from the pad tracker circuit and generate, based on the output voltage signal, a dynamic gate control signal that toggles between the first reference voltage signal and the second reference voltage signal; and
   a driver circuit coupled to the first clamper circuit, the driver circuit configured to receive the dynamic gate control signal that toggles between the first reference voltage signal and the second reference voltage signal.

2. The generator circuit of claim 1, wherein the pad tracker circuit further comprises:
   a pad clipper circuit configured to receive the output voltage of the pad and limit the high voltage to the second reference voltage signal; and
   a buffer coupled to the pad clipper circuit, the buffer configured to buffer the high voltage of the pad.

3. The generator circuit of claim 1, wherein the first reference voltage signal is a voltage stress limit of the driver circuit, and wherein the second reference voltage signal is a difference between the supply voltage (VDDIO) and the first reference voltage signal.

4. The generator circuit of claim 3, wherein the supply voltage is greater than two times the voltage stress limit of the driver circuit.

5. The generator circuit of claim 1, wherein the driver circuit further comprises:
   at least three first type of transistors coupled in series; and
   at least three second type of transistors coupled in series.

6. The generator circuit of claim 5, wherein the at least three first type of transistors comprise a N-metal oxide semiconductor (NMOS) field effect transistor, and wherein the at least three second type of transistors comprise a P-metal oxide semiconductor (PMOS) field effect transistor.

7. The generator circuit of claim 5, further comprising:
   a second clamper circuit coupled to the first clamper circuit, the second clamper circuit configured to receive the dynamic gate control signal and the output voltage of the pad and generate, based on the dynamic gate control signal and the output voltage of the pad, a second dynamic gate control signal that toggles between the first reference voltage signal and the output voltage of the pad; and
   a second driver circuit coupled to the second clamper circuit, the second driver circuit configured to receive the second dynamic gate control signal that toggles between the first reference voltage signal and the output voltage of the pad.

8. The generator circuit of claim 7, wherein the second driver circuit further comprises:
a fourth first type of transistor coupled in series to the at least three first type of transistors; and
a fourth second type of transistor coupled in series to the at least three second type of transistors.

9. The generator circuit of claim 1, wherein the reference generator is further configured to produce, based on the supply voltage, a third reference voltage signal, wherein the first reference voltage signal is a voltage stress limit of the driver circuit, wherein the second reference voltage signal is a sum of the first reference voltage signal and the voltage stress limit of the driver circuit, and wherein the third reference voltage signal is a difference between the supply voltage (VDDIO) and the voltage stress limit of the driver circuit.

10. The generator circuit of claim 9, further comprising:
a second clamper circuit coupled to the first clamper circuit, the second clamper circuit configured to receive the dynamic gate control signal and the second reference voltage signal and generate, based on the dynamic gate control signal and the second reference voltage signal, a second dynamic gate control signal that toggles between the second reference voltage signal and the third reference voltage signal; and
a first clipper circuit coupled in parallel to the second clamper circuit, the first clipper circuit configured to receive the dynamic gate control signal and the second reference voltage signal and generate, based on the dynamic gate control signal and the second reference voltage signal, a third dynamic gate control signal that toggles between the first reference voltage signal and the second reference voltage signal.

11. A method for dynamic gate control signal generation, the method comprising:
receiving, by a reference generator, a supply voltage (VDDIO) and producing, based on the supply voltage, a first reference voltage signal and a second reference voltage signal;
receiving, by a pad tracker circuit coupled to the reference generator, an output voltage of a pad and limiting a high voltage of the pad to the second reference voltage signal;
receiving, by a first clamper circuit coupled to the pad tracker circuit, an output voltage signal from the pad tracker circuit and generating, based on the output voltage signal, a dynamic gate control signal that toggles between the first reference voltage signal and the second reference voltage signal; and
receiving, by a driver circuit coupled to the first clamper circuit, the dynamic gate control signal that toggles between the first reference voltage signal and the second reference voltage signal.

12. The method of claim 11, further comprising:
receiving, by a pad clipper circuit, the output voltage of the pad and limiting the high voltage to the second reference voltage signal; and
buffering, by a buffer circuit coupled to the pad clipper circuit, the high voltage of the pad.

13. The method of claim 11, wherein the first reference voltage signal is a voltage stress limit of the driver circuit, and wherein the second reference voltage signal is a difference between the supply voltage (VDDIO) and the first reference voltage signal.

14. The method of claim 13, wherein the supply voltage is greater than two times the voltage stress limit of the driver circuit.

15. The method of claim 11, further comprising:
providing, as part of the driver circuit, at least three first type of transistors coupled in series; and
providing, as part of the driver circuit, at least three second type of transistors coupled in series.

16. The method of claim 15, wherein the at least three first type of transistors comprise a N-metal oxide semiconductor (NMOS) field effect transistor, and wherein the at least three second type of transistors comprise a P-metal oxide semiconductor (PMOS) field effect transistor.

17. The method of claim 15, further comprising:
receiving, by a second clamper circuit coupled to the first clamper circuit, the dynamic gate control signal and the output voltage of the pad and generating, based on the dynamic gate control signal and the output voltage of the pad, a second dynamic gate control signal that toggles between the first reference voltage signal and the output voltage of the pad; and
receiving, by a second driver circuit coupled to the second clamper circuit, the second dynamic gate control signal that toggles between the first reference voltage signal and the output voltage of the pad.

18. The method of claim 17, further comprising:
providing, as part of the second driver circuit, a fourth first type of transistor coupled in series to the at least three first type of transistors; and
providing, as part of the second driver circuit, a fourth second type of transistor coupled in series to the at least three second type of transistors.

19. The method of claim 11, further comprising:
generating, by the reference generator, based on the supply voltage, a third reference voltage signal, wherein the first reference voltage signal is a voltage stress limit of the driver circuit, wherein the second reference voltage signal is a sum of the first reference voltage signal and the voltage stress limit of the driver circuit, and wherein the third reference voltage signal is a difference between the supply voltage (VDDIO) and the voltage stress limit of the driver circuit.

20. An interface circuit comprising:
a reference generator circuit configured to receive a supply voltage (VDDIO) and produce, based on the supply voltage, a first reference voltage signal and a second reference voltage signal;
a pad tracker circuit coupled to the reference generator circuit, the pad tracker circuit configured to receive an output voltage of a pad and limit a high voltage of the pad to the second reference voltage signal;
a first clamper circuit coupled to the pad tracked, the first clamper circuit configured to receive an output voltage signal from the pad tracker circuit and generate, based on the output voltage signal, a dynamic gate control signal that toggles between the first reference voltage signal and the second reference voltage signal; and
a driver circuit coupled to the first clamper circuit, the driver circuit configured to receive the dynamic gate control signal that toggles between the first reference voltage signal and the second reference voltage signal.

* * * * *